United States Patent
Yu

(10) Patent No.: US 6,399,450 B1
(45) Date of Patent: Jun. 4, 2002

(54) LOW THERMAL BUDGET PROCESS FOR MANUFACTURING MOS TRANSISTORS HAVING ELEVATED SOURCE AND DRAIN REGIONS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/609,613

(22) Filed: Jul. 5, 2000

(51) Int. Cl.[7] .............................................. H01L 21/336
(52) U.S. Cl. ...................................................... 438/300
(58) Field of Search ................................. 438/300, 163, 438/166, 486, FOR 242, FOR 196

(56) References Cited

U.S. PATENT DOCUMENTS

| | | |
|---|---|---|
| 4,683,645 A | 8/1987 | Naguib et al. |
| 4,745,082 A | 5/1988 | Kwok |
| 4,784,718 A | 11/1988 | Mitani et al. |
| 4,835,112 A | 5/1989 | Pfiester et al. |
| 4,954,867 A | 9/1990 | Hosaka |
| 5,108,954 A | 4/1992 | Sandhu et al. |
| 5,258,637 A | 11/1993 | Sandhu et al. |
| 5,264,382 A | 11/1993 | Watanabe |
| 5,374,575 A | 12/1994 | Kim et al. |
| 5,391,510 A | 2/1995 | Hsu et al. |
| 5,393,685 A | 2/1995 | Yoo et al. |
| 5,429,956 A | 7/1995 | Shell et al. |
| 5,491,099 A | 2/1996 | Hsu |
| 5,593,907 A | 1/1997 | Anjum et al. |
| 5,595,919 A | 1/1997 | Pan |
| 5,607,884 A | 3/1997 | Byun |
| 6,137,149 A * | 6/1997 | Kodama |
| 5,654,570 A | 8/1997 | Agnello |
| 5,675,159 A | 10/1997 | Oku et al. |
| 5,716,861 A | 2/1998 | Moslehi |
| 5,736,446 A | 4/1998 | Wu |
| 6,033,958 A * | 6/1998 | Chou et al. |
| 5,789,792 A * | 8/1998 | Tsutsumi |
| 5,793,090 A | 8/1998 | Gardner et al. |
| 5,811,323 A | 9/1998 | Miyasaka et al. |
| 5,825,066 A | 10/1998 | Buynoski |
| 6,200,867 B1 * | 11/1998 | Chen |
| 5,851,869 A | 12/1998 | Urayama |
| 5,856,225 A | 1/1999 | Lee et al. |
| 5,858,843 A | 1/1999 | Doyle et al. |
| 5,888,888 A | 3/1999 | Talwar et al. |
| 6,156,613 A * | 5/1999 | Wu |

(List continued on next page.)

FOREIGN PATENT DOCUMENTS

| | | | |
|---|---|---|---|
| JP | 3-248433 | | 11/1991 |
| JP | 4-123439 | | 4/1992 |
| JP | 5-160396 | | 6/1993 |
| JP | 05206454 A | * | 8/1993 |
| JP | 08017845 A | * | 1/1996 |
| JP | 11102907 A | * | 4/1996 |

OTHER PUBLICATIONS

"Silicon Processing for the VLSI Era, vol. 1: Process Technology", Wolf, et al. Lattice Press, Sunset Beach, California, 1986, pp 296–308.

Journal of Applied Physics vol. 50, No. 1, Jan. 1979, "Recrystallization of implanted amorphous silicon Layers", Tsai, et al. pp 183–187.

(List continued on next page.)

*Primary Examiner*—George Fourson
*Assistant Examiner*—Thanh V Pham
(74) *Attorney, Agent, or Firm*—Foley & Lardner

(57) ABSTRACT

A method of manufacturing an integrated circuit utilizes solid phase epitaxy to form an elevated source and an elevated drain region. The method includes providing an amorphous semiconductor material, doping the amorphous material at a source location and drain location and crystallizing the amorphous semiconductor material via solid phase epitaxy. The semiconductor material can be silicided. A shallow source drain implant can also be provided.

20 Claims, 3 Drawing Sheets

U.S. PATENT DOCUMENTS

| | | | |
|---|---|---|---|
| 5,908,307 | A | 6/1999 | Talwar et al. |
| 5,915,182 | A | 6/1999 | Wu |
| 5,915,196 | A | 6/1999 | Mineji |
| 6,187,642 | B1 * | 6/1999 | Yu et al. |
| 5,953,616 | A | 9/1999 | Ahn |
| 6,110,787 | A * | 9/1999 | Chan et al. |
| 5,985,726 | A | 11/1999 | Yu et al. |
| 6,087,235 | A * | 11/1999 | Yu |
| 6,190,977 | B1 * | 11/1999 | Wu |
| 6,008,111 | A | 12/1999 | Fushida et al. |
| 6,017,808 | A | 1/2000 | Wang et al. |
| 6,030,863 | A | 2/2000 | Chang et al. |
| 6,037,204 | A | 3/2000 | Chang et al. |
| 6,072,222 | A | 6/2000 | Nistler |
| 6,080,645 | A | 6/2000 | Pan |
| 6,103,609 | A | 8/2000 | Lee et al. |
| 6,110,783 | A | 8/2000 | Burr |
| 6,248,637 | B1 | 6/2001 | Yu |

OTHER PUBLICATIONS

Huang, et al. "Sub 50–nm Fin FET: PMOS", Department of Electrical Engineering and Computer Sciences, University of California at Berkeley, CA 94720. 1999 IEEE.

Yu, et al. "Ultra–Thin–Body Silicon–on–Insulator MOSFET's for Terabit–Scale Integration" Department of Electrical Engineering and Computer Sciences, University of California Berkeley. (No dated).

Chatterjee, et al. "Sub–100nm Gate Length Metal Gate NMOS Transistors Fabricated by a Replacement Gate Process", International Electronics Devices Meeting, Dec. 7–10, 1997.

* cited by examiner

LOW THERMAL BUDGET PROCESS FOR MANUFACTURING MOS TRANSISTORS HAVING ELEVATED SOURCE AND DRAIN REGIONS

CROSS REFERENCE TO RELATED APPLICATIONS

This patent application is related to U.S. application Ser. No. 09/405,831, filed on Sep. 24, 1999 by Yu, entitled "A Process for Manufacturing MOS Transistors Having Elevated Source and Drain Regions," U.S. application Ser. No. 09/255,546, filed on Feb. 22, 1999 by Yu entitled "Locally Confined Deep Pocket Process for ULSI MOSFETS," U.S. application Ser. No. 09/397,217 filed on Sep. 16, 1999 by Yu, et al. entitled "Source/Drain Doping Technique for Ultra-Thin-Body SOI MOS Transistors," and U.S. application Ser. No. 09/384,121 filed on Aug. 27, 1999 by Yu entitled "CMOS Transistors Fabricated in Optimized RTA Scheme." This patent is also related to U.S. application Ser. No. 09/599,270, filed on an even date herewith by Yu entitled "A Solid Phase Epitaxy Process For Manufacturing Transistor Silicon/Germanium Channel Regions". All are assigned to the assignee of the present invention.

BACKGROUND OF THE INVENTION

The present invention relates to integrated circuits (ICs) and methods of manufacturing integrated circuits. More particularly, the present invention relates to a method of manufacturing integrated circuits having transistors with elevated source and drain regions.

Currently, deep-submicron complementary metal oxide semiconductor (CMOS) is the primary technology for ultra-large scale integrated (ULSI) devices. Over the last two decades, reducing the size of CMOS transistors and increasing transistor density on ICs has been a principal focus of the microelectronics industry. An ultra-large scale integrated circuit can include over 1 million transistors.

The ULSI circuit can include CMOS field effect transistors (FETS) which have semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region just below the top surface of the substrate to form the drain and source extensions as well as to partially form the drain and source regions.

After the drain and source extensions are formed, silicon dioxide spacers, which abut lateral sides of the gate structure, are provided over the source and drain extensions. With the silicon dioxide spacers in place, the substrate is doped a second time to form deep source and drain regions. During formation of the deep source and drain regions, further doping of the source and drain extensions is inhibited due to the blocking capability of the silicon dioxide spacers.

As the size of transistors disposed on ICs decreases, transistors with shallow and ultra-shallow source/drain extensions become more difficult to manufacture. For example, a small transistor may require ultra-shallow source and drain extensions with less than 30 nanometer (nm) junction depth. Forming source and drain extensions with junction depths of less than 30 nm is very difficult using conventional fabrication techniques. Conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically downward into the bulk semiconductor substrate. Also, conventional ion implantation and diffusion-doping techniques make transistors on the IC susceptible to short-channel effects, which result in a dopant profile tail distribution that extends deep into the substrate.

The source region and drain regions can be raised by selective silicon (Si) epitaxy to make connections to source and drain contacts less difficult. The raised source and drain regions provide additional material for contact silicidation processes and reduce deep source/drain junction resistance and source/drain series resistance. However, the epitaxy process that forms the raised source and drain regions generally requires high temperatures exceeding 1000° C. (e.g., 1100–1200° C.). These high temperatures increase the thermal budget of the process and can adversely affect the formation of steep retrograde well regions and ultra shallow source/drain extensions.

The high temperatures, often referred to as high thermal budget, can produce significant thermal diffusion which can cause shorts between the source and drain region (between the source/drain extensions). The potential for shorting between the source and drain region increases as gate lengths decrease.

Thus, there is a need for an integrated circuit or electronic device that includes transistors not susceptible to shorts caused by dopant thermal diffusion. Further still, there is a need for transistors with elevated source and drain regions manufactured in an optimized annealing process. Even further still, there is a need for elevated source and drain regions which are formed in a low thermal budget (low temperature) process.

SUMMARY OF THE INVENTION

An exemplary embodiment relates to a method of manufacturing and integrated circuit. The integrated circuit includes a gate structure on a substrate. The substrate includes a shallow source and drain extension dopant implant. The gate structure includes a gate conductor. The method includes providing an amorphous semiconductor material above the substrate and over the gate structure, removing a portion of the amorphous semiconductor material to expose the gate conductor, doping the amorphous semiconductor material at a source location and a drain location to form a deep source region and a deep drain region, and forming a single crystalline semiconductor material from the amorphous semiconductor material via solid phase epitaxy.

Another exemplary embodiment relates to a method of manufacturing an ultralarge scale integrated circuit including a transistor. The method includes steps of providing a gate structure on a top surface of a substrate, depositing an amorphous semiconductor material, polishing the amorphous semiconductor material, doping the amorphous semiconductor material, and crystallizing the amorphous semiconductor material. The amorphous semiconductor material is deposited above the top surface of the substrate. The amorphous semiconductor material is doped for a deep source region and a deep drain region of the transistor. The amorphous semiconductor material is crystallized via solid phase epitaxy.

Yet another embodiment relates to a process of forming a transistor with elevated source and drain regions. The process includes providing a gate structure having a gate conductor above a substrate, providing a shallow source drain extension dopant implant to the substrate, providing a spacer structure to the gate conductor, and depositing amorphous semiconductor material above the substrate and the gate structure. The method also includes steps of providing a deep source drain dopant implant to the amorphous semiconductor material and crystallizing the amorphous semiconductor material to form single crystalline material via solid phase epitaxy.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
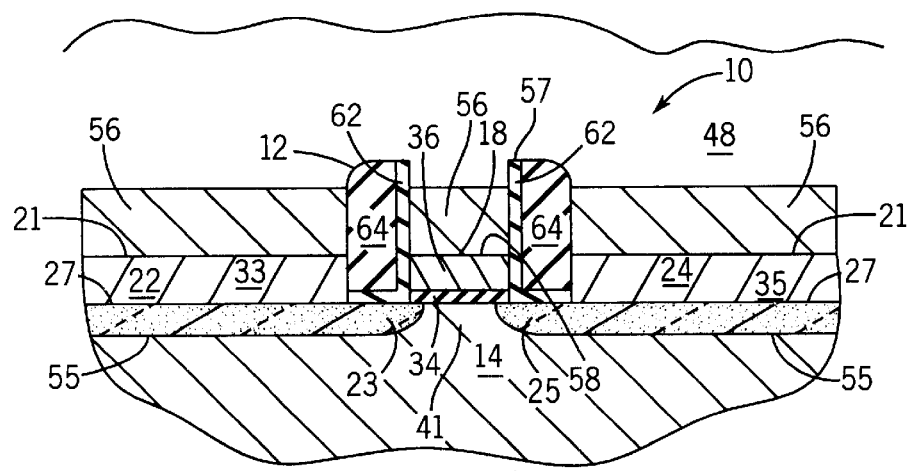
FIG. 1 is a cross-sectional view of a portion of an integrated circuit in accordance with an exemplary embodiment of the present invention, the integrated circuit including a transistor with elevated source and drain regions provided on a semiconductor substrate.

With reference to FIG. 1, a portion 10 of an integrated circuit (IC) includes a transistor 12 which is disposed on a semiconductor substrate 14, 20 such as, a wafer. Semiconductor substrate 14 is preferably a bulk P-type silicon substrate. Alternatively, substrate 14 can be a gallium arsenide (GaAs), germanium, or a semiconductor-on-insulator (SOI) substrate (a silicon-on-glass substrate).

Transistor 12 can be a P-channel or N-channel metal oxide semiconductor field effect transistor (MOSFET) and is described below as an N-channel transistor. Transistor 12 includes a gate structure 18, an elevated source region 22, and an elevated drain region 24. Regions 22 and 24 extend from a top surface 21 (above a top surface 27 of substrate 14) to a bottom 55 in substrate 14.

Regions 22 and 24 are 250–550 Å deep (from surface 21 to bottom 55) and include a source extension 23, a drain extension 25, a deep source region 33, and a deep drain region 35. For an N-channel transistor, regions 22 and 24 are heavily doped with N-type dopants (e.g., $5 \times 10^{19}$–$1 \times 10^{20}$ dopants per cubic centimeter). For a P-channel transistor, regions 22 and 24 are heavily doped with P-type dopants ($5 \times 10^{19}$–$1 \times 10^{20}$ dopants per cubic centimeter).

Extensions 23 and 25 are preferably ultra-shallow extensions (e.g., junction depth is less than 20 nanometers (nm), 100–250 Å), which are thinner than regions 22 and 24. Extensions 23 and 25 are connected to regions 33 and 35, respectively, and are disposed partially underneath gate structure 18. Regions 33 and 35 are preferably more than 150 Å thick (e.g. 150–300 Å) from surface 21 to surface 27. A channel region 41 underneath gate structure 18 separates extensions 23 and 25.

Ultra-shallow extensions 23 and 25 help transistor 12 achieve substantial immunity to short-channel effects. Short-channel effects can degrade performance of transistor 12 as well as the manufacturability of the IC associated with transistor 12. Regions 22 and 24 and extensions 23 and 25 have a concentration of $10^{19}$ to $10^{20}$ dopants per cubic centimeter. An appropriate dopant for a P-channel transistor is boron, boron diflouride, or iridium, and an appropriate dopant for a N-type transistor is arsenic, phosphorous, or antimony.

Gate stack or structure 18 includes a gate dielectric layer 34 and a gate conductor 36. Dielectric layer 34 is preferably comprised of thermally grown 10–25 Å (preferably 12–20 Å) thick silicon dioxide material. Alternatively, deposited nitride ($Si_3N_4$) layers, oxide layers, or high-K dielectric layers can be utilized as layer 34. A tetraethylorthosilicate (TEOS) deposited insulative layer 48 can cover structure 18 and serve as an insulative covering for transistor 12.

Conductor 36 is preferably doped or undoped polysilicon deposited by chemical vapor deposition (CVD) and etched to form the particular structure for transistor 12. Conductor 36 is preferably polysilicon. Gate structure 18 has a height or thickness of 800–1200 Å.

Gate structure 18 is disposed over a channel region 41. Gate structure 18 can also include L-shaped oxide liners 62. Oxide liners 62 abut sidewalls of gate conductor 36. Gate structure 18 can further include a pair of spacers 64. Spacers 64 are preferably silicon nitride ($Si_3N^4$) material having a width of 600–900 Å and a thickness of 1000–1500. Liners 62 are 100–200 Å wide and provided as a buffer between spacers 64, regions 22 and 24, and conductor 36. A silicide layer 56 is deposited or sputtered on top of gate conductor 36, source region 22 and drain region 24. Preferably, layer 56 is tungsten silicide (WSix). Alternatively, layer 56 can be any type of refractory metal and silicon combination, such as, a cobalt silicide, nickel silicide, or other silicide material. Layer 56 is also disposed above gate conductor 36. Preferably, layer 56 is 700–1800 Å thick. Accordingly, gate conductor 36 is 150–300 Å thick from a surface 58 to layer 34. Metal contacts can be coupled to layer 56 through insulating layer 48.

Transistor 12 can be an N-channel or a P-channel field effect transistor, such as, a metal oxide semiconductor field effect transistor (MOSFET). Transistor 12 is at least partially covered by insulative layer 48 and is preferably part of an ultra-large scale integrated (ULSI) circuit that includes one million or more transistors.

With reference to FIGS. 1–8, the fabrication of transistor 12, including elevated source region 22 and elevated drain region 24, is described as follows. The advantageous process allows deep source and drain regions 33 and 35 to be formed in a low thermal budget process while annealing source and drain regions 22 and 24 and gate conductor 36 in a high thermal budget process. The low thermal budget reduces the lateral spread of dopants into channel 41 and thereby reduces susceptibility to short circuits between extension 23 and 25.

Figure 2:
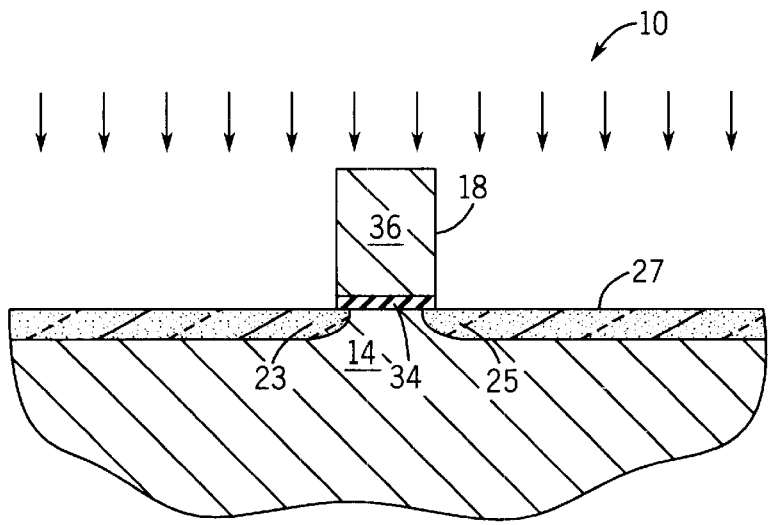
FIG. 2 is a cross-sectional view of the portion of the integrated circuit illustrated in FIG. 1, showing a gate stack formation step and a shallow source and drain extension dopant implant step.

In FIG. 2, transistor 12 can be substantially formed by conventional semiconductor processing techniques to include gate structure 18. Substrate 14 can be any type of substrate including a semiconductor material at surface 27. Preferably, gate conductor 36 is deposited as a 1000–1500 Å thick layer on top of a 12–20 Å oxide layer.

Substrate 14 is subjected to a shallow source drain extension dopant implant. Preferably, N-type or P-type dopants are provided by ion implantation to a depth of 100–250 Å below surface 27. The dopants can be implanted in a conventional ion implantation technique (e.g., as ions at 500–1000 keV at a dose of $2 \times 10^{14} - 1 \times 10^{15}$ dopants per square centimeter). The source drain extension dopant implant is for the formation of extensions 23 and 25 and regions 33 and 35 in substrate 14.

Gate conductor 36 is preferably 800–1200 Å thick, undoped polysilicon material. Conductor 36 is preferably deposited by a chemical vapor deposition (CVD) process on top of layer 34. Layer 34 can be thermally grown on substrate 14. The undoped polysilicon conductor 36 can be selectively etched to leave gate structure 18. Preferably, the selective etch is a dry etch.

Figure 3:
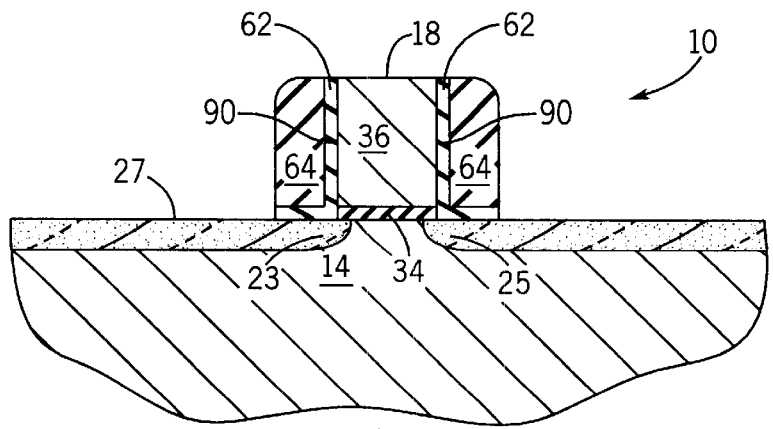
FIG. 3 is a cross-sectional view of the portion of the integrated circuit illustrated in FIG. 2, showing a spacer structure formation step.

In FIG. 3, portion 10 is subjected to an oxidation process which forms oxide L-shaped liners 62 on side walls 90 of gate conductor 18. Preferably, oxidized structures are formed by plasma enhanced chemical vapor deposition (PECVD). Liners 62 are preferably 100–200 Å wide (e.g., left to right) and 1000–1500 Å thick (e.g., top to bottom). After liners 62 are deposited, spacers 64 are formed in a conventional nitride deposition and etch-back technique. The etching step associated with spacers 64 also includes a step for removing oxide material associated with the deposition step for liners 62. Nitride spacers 64 and oxide liners 62 can effectively protect layer 34 during subsequent processing steps.

Figure 4:
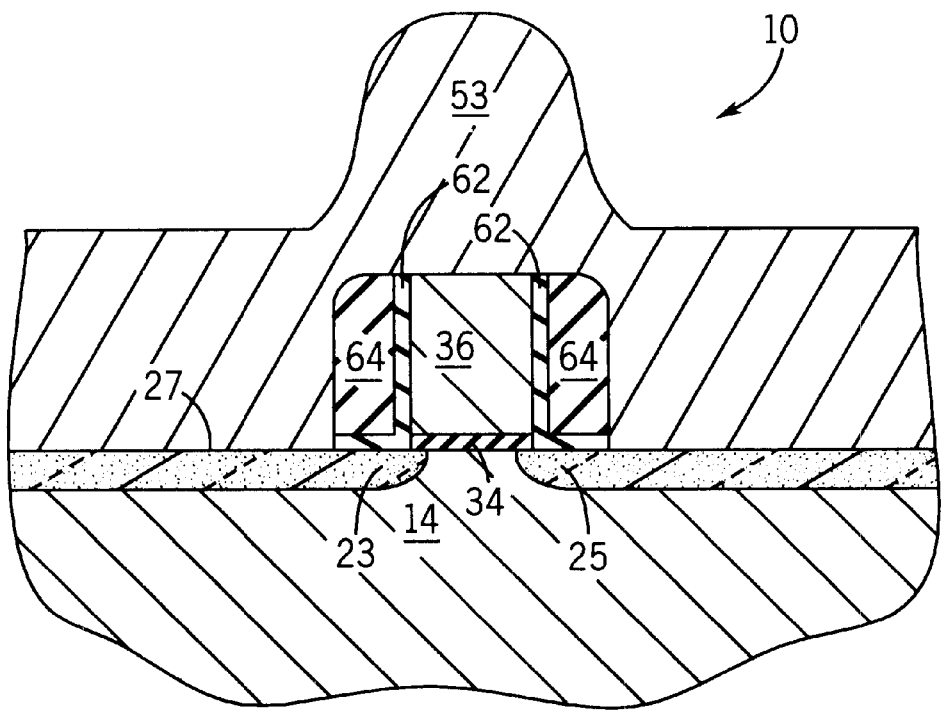
FIG. 4 is a cross-sectional view of the portion of the integrated circuit illustrated in FIG. 3, showing an amorphous semiconductor deposition step.

In FIG. 4, after gate structure 18 is formed including spacers 64, portion 10 is subjected to a deposition process which provides an amorphous semiconductor layer 53 above top surface 27 of substrate 14. Layer 53 is preferably a 3000–5000 Å thick film of the same material as substrate 14 (e.g., silicon). Alternatively, layer 53 can be or include other semiconductor material such as germanium. Layer 53 can be deposited by low pressure chemical vapor deposition (LPCVD) at temperatures of less than 500° C. (450–500° C.). Layer 53 corresponds to regions 33 and 35 above top surface 27 (See FIG. 1).

Figure 5:
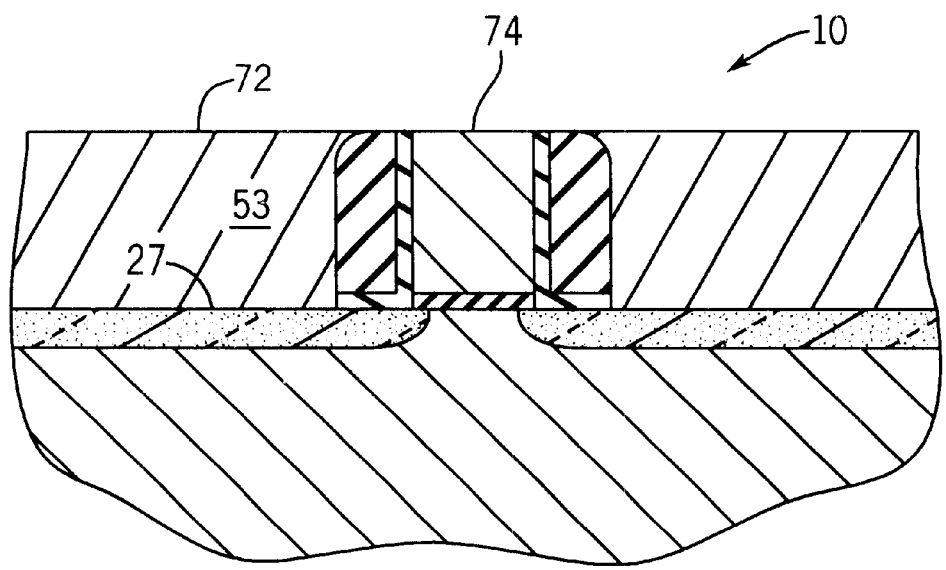
FIG. 5 is a cross-sectional view of the portion of the integrated circuit illustrated in FIG. 4, showing a chemical mechanical polish (CMP) step.

In FIG. 5, after layer 53 is provided on top surface 27 of substrate 14, layer 53 is subject to a planarization process, such as, a chemical mechanical polish (CMP). The CMP step removes layer 53 to expose gate conductor 36 in structure 18. Preferably, a surface 72 of layer 53 is coplanar with a surface 74 of gate conductor 36.

Figure 6:
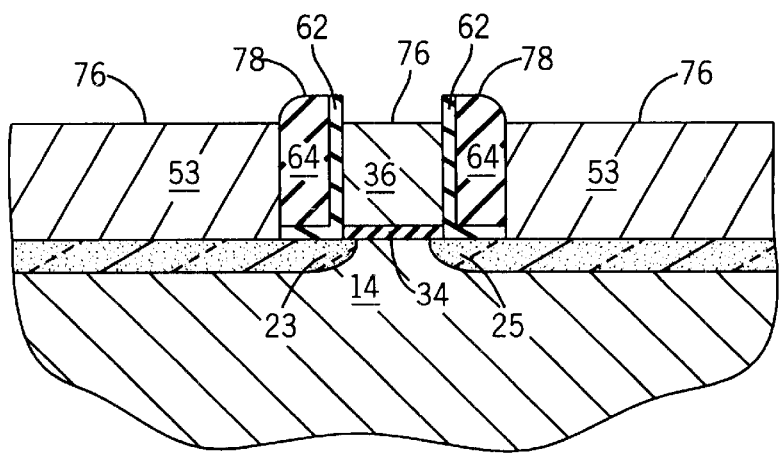
FIG. 6 is a cross-sectional view of the portion of the integrated circuit illustrated in FIG. 1, showing a chemical etching step.

In FIG. 6, after planarazation, layer 53 is stripped in a chemical etch (e.g., a wet chemical etch) or a plasma dry-etch. Preferably, the wet chemical etch removes 200–300 Å of layer 53 and gate conductor 36. The chemical etching step prevents bridging during subsequent silicidation steps. Preferably, a surface 76 is 200–300 Å below a top surface 78 of spacers 64.

Figure 7:
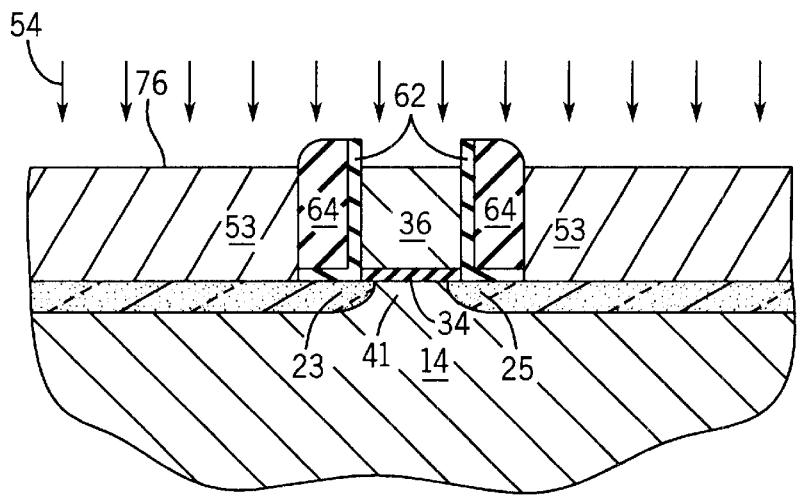
FIG. 7 is a cross-sectional view of the portion of the integrated circuit illustrated in FIG. 1, showing a deep source and drain doping step.

In FIG. 7, after portions of layer 53 are removed, portion 10 is subject to a deep source drain implant (e.g., layer 53 and substrate 14 are doped utilizing non-neutral dopants 54). Preferably, non-neutral dopants, such as, phosphorous (P), boron (B), arsenic (As), antimony (Sb), indium (In), and gallium (Ga) are implanted into substrate 14 and layer 53 (source region 22 and drain region 24 in FIG. 1). Conductor 36 serves to protect channel region 41 from the dopant implant. In addition, the dopant implant provides dopants to conductor 36. Dopants 53 can be provided by conventional ion implantation (e.g., as dopants at 10 keV–20 keV at a dose of $1 \times 10^{15} - 5 \times 10^{15}$ dopants per square centimeter).

Figure 8:
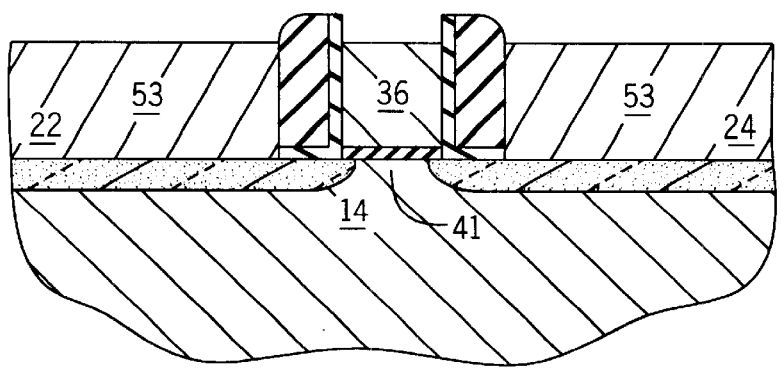
FIG. 8 is a cross-sectional view of the portion of the integrated circuit illustrated in FIG. 1, showing a solid phase epitaxy step.

In FIG. 8, after doping, layer 53 is subjected to an annealing process. The annealing process changes the structure of layer 53 from an amorphous state to a single crystalline state (e.g., melts layer 53 which subsequently recrystallizes). Preferably, a solid phase epitaxy technique is utilized to crystallize layer 53. Solid phase epitaxy refers to a crystallization process by which an amorphous semiconductor film (silicon, silicon/germanium, or germanium) is converted into crystalline semiconductor (silicon, silicon/ germanium, or germanium) of a single orientation matching the orientation of an existing crystalline semiconductor (silicon, silicon/germanium, or germanium) start layer. Solid phase epitaxy is usually achieved by heating the amorphous semiconductor. Preferably, a low temperature (e.g., 550–600° C.) rapid thermal anneal (RTA) is utilized. Substrate 14 acts as a seed or start layer for recrystallization of layer 53.

Preferably, the solid phase epitaxy is performed at a low temperature so that the thermal budget of the process is not adversely affected. In this way, the interface between the silicon material of substrate 14 and the silicon/germanium material in channel region 41 is very sharp (e.g., a negligible transition region or a transition region which does not appreciably affect the operation of transistor 12).

In one alternative embodiment, the annealing process is an excimer laser process (e.g., 308 nanometer wavelength) for a pulse duration of several nanoseconds. The annealing technique using an excimer laser can raise the temperature of layer 53 to the melting temperature of layer 53 (1100° C. for silicon germanium). The melting temperature of layer 53 in the amorphous state is significantly lower than that of substrate 14 which is in a crystalline state. For example, the melting temperature of amorphous silicon is 1100° C. and the melting temperature of a single crystalline silicon substrate (C—Si) is 1400° C. Preferably, the annealing process is controlled so that layer 53 is fully melted and substrate 14 is not melted. After the energy associated with the annealing process is removed, layer 53 is recrystallized as a single crystalline material.

After the epitaxy step, a high temperature rapid thermal anneal (RTA) (1000–1100° C.) is utilized to activate dopants in conductor 36 and regions 22 and 24 to ensure low contact series resistance and reduced gate depletion effect.

In FIG. 1, layer 56 is formed above regions 22 and 24 and conductor 36. Layer 56 is preferably formed in a conventional self-aligned silicide process. Layer 56 can be CoSi$_2$, TiSi, NiSi$_2$. Elevated source and drain regions, regions 22 and 24, allow space for layers 56 and 58 to form, thereby decreasing source/drain contact resistance.

Layer 56 is preferably 700 Å–1800 Å thick and approximately 60 percent of its thickness consumes layer 53. After layer 56 is formed, layer 48 is deposited in accordance with a tetraethylorthosilicate (TEOS) process. Preferably, layer 48 is 5000–15000 Å thick. After layer 48 is deposited, conventional MOSFET fabrication processes can be utilized to form contacts, vias, interconnects, and other devices necessary for portion 10 of the integrated circuit.

The process discussed with reference to FIGS. 1–8 provides advantages over processes which utilizes solid phase epitaxy to form elevated source and drain regions.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of structures are shown, other structures can be utilized. Various changes may be made to the details disclosed without departing from the spirit of the invention which is defined by the following claims.

What is claimed is:

1. A method of manufacturing an integrated circuit, the integrated circuit including a gate structure on a substrate, the substrate including a shallow source and drain extension dopant implant, the gate structure including a gate conductor, the method comprising:

providing an amorphous semiconductor material above the substrate and over the gate structure;

removing a portion of the amorphous semiconductor material to expose the gate conductor;

doping the amorphous semiconductor material at a source location and a drain location to form a deep source region and a deep drain region; and forming a single crystalline semiconductor material from the amorphous semiconductor material via solid phase epitaxy.

2. The method of claim 1 further comprising:

before the doping step, removing another portion of the amorphous semiconductor material and the gate conductor by chemical etching.

3. The method of claim 1 further comprising:

after the forming step, siliciding the gate conductor and the single crystalline material at the source location and the drain location, wherein a top surface of a first silicide layer above the gate conductor and a top surface above a second silicide layer above the source location are co-planer.

4. The method of claim 1, wherein the gate structure includes an L-shaped liner oxide and a nitride spacer.

5. The method of claim 1, wherein the forming step includes a low temperature annealing step.

6. The method of claim 1, wherein the amorphous semiconductor material includes silicon.

7. The method of claim 1, wherein the substrate includes single crystalline silicon.

8. The method of claim 1, wherein the amorphous semiconductor layer includes silicon germanium.

9. The method of claim 1, further comprising:

performing a high temperature rapid thermal anneal to activate dopants at the source location and the drain location.

10. A method of manufacturing an ultra-large scale integrated circuit including a transistor, the method comprising steps of:

providing a gate structure on a top surface of a substrate;

depositing an amorphous semiconductor material above the top surface of the substrate;

polishing the amorphous semiconductor material;

doping the amorphous semiconductor material for a deep source region and a deep drain region of the transistor; and crystallizing the amorphous semiconductor material via solid phase epitaxy.

11. The method of claim 10, further comprising:

providing source and drain extension implants before the depositing step.

12. The method of claim 11, further comprising:

providing a silicide layer in the deep source region and the deep drain region.

13. The method of claim 12, wherein the amorphous semiconductor material includes silicon.

14. The method of claim 12, wherein the solid phase epitaxy step includes a rapid thermal anneal at a temperature between 550–600° C.

15. The method of claim 12, wherein the amorphous semiconductor material is 3000–5000 Å thick.

16. The method of claim 12, wherein the solid phase epitaxy utilizes an annealing temperature below 600° C.

17. A process of forming a transistor with elevated source and drain regions, the process comprising:

providing a gate structure having a gate conductor above a substrate;

providing a shallow source drain extension dopant implant to the substrate;

providing a spacer structure to the gate conductor;

depositing an amorphous semiconductor material above the substrate and the gate structure;

providing a deep source drain dopant implant to the amorphous semiconductor material; and crystallizing the amorphous semiconductor material to form single crystalline material via solid phase epitaxy.

18. The process of claim 17, wherein the spacer structure includes L-shaped liner structures and a spacer.

19. The process of claim 17, wherein the amorphous semiconductor material is 3000–5000 Å thick.

20. The process of claim 17, wherein the amorphous semiconductor material is polished and wet-etched before the crystallizing step.

* * * * *